(12) United States Patent
Bu

(10) Patent No.: US 9,379,206 B2
(45) Date of Patent: Jun. 28, 2016

(54) SEMICONDUCTOR DEVICE AND FABRICATION METHOD THEREOF

(71) Applicant: Semiconductor Manufacturing International (Shanghai) Corporation, Shanghai (CN)

(72) Inventor: WeiHai Bu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 80 days.

(21) Appl. No.: 14/012,900

(22) Filed: Aug. 28, 2013

(65) Prior Publication Data

US 2014/0110769 A1 Apr. 24, 2014

(30) Foreign Application Priority Data

Oct. 23, 2012 (CN) .......................... 2012 1 0406039

(51) Int. Cl.
*H01L 21/336* (2006.01)
*H01L 29/66* (2006.01)
*H01L 21/02* (2006.01)
*H01L 29/78* (2006.01)
*H01L 29/165* (2006.01)

(52) U.S. Cl.
CPC .... *H01L 29/66477* (2013.01); *H01L 21/02381* (2013.01); *H01L 21/02532* (2013.01); *H01L 21/02639* (2013.01); *H01L 29/6653* (2013.01); *H01L 29/6656* (2013.01); *H01L 29/66636* (2013.01); *H01L 29/7834* (2013.01); *H01L 29/7848* (2013.01); *H01L 29/165* (2013.01)

(58) Field of Classification Search
CPC .......................... H01L 29/78; H01L 29/66477
USPC ........................... 257/288; 438/301
See application file for complete search history.

(56) References Cited

U.S. PATENT DOCUMENTS

| 7,446,394 B2* | 11/2008 | Fukuda et al. ................ 257/632 |
| 2010/0289093 A1* | 11/2010 | Yang et al. .................... 257/408 |
| 2011/0104875 A1* | 5/2011 | Wojtczak et al. ............. 438/478 |

FOREIGN PATENT DOCUMENTS

CN 1574398 A 2/2005

* cited by examiner

*Primary Examiner* — Theresa T Doan
(74) *Attorney, Agent, or Firm* — Innovation Counsel LLP

(57) ABSTRACT

A semiconductor device fabrication method is provided in which recesses are formed at source/drain positions in the substrate, removable sidewalls are formed on side walls of the recess, and the recesses then are etched to form Sigma shaped recesses. Selective epitaxial growth of substantially un-doped SiGe in the Sigma shaped recesses is performed, and the Sigma shaped recesses close to the surface of the substrate can be protected from epitaxial growth by the removable sidewalls. Epitaxial growth of SiGe doped with a P-type impurity can be performed in the Sigma shaped recesses after removing the sidewalls.

9 Claims, 13 Drawing Sheets

SEMICONDUCTOR DEVICE AND FABRICATION METHOD THEREOF

CROSS-REFERENCE TO RELATED APPLICATIONS

This application claims priority to Chinese Patent Application No. 201210406039.4, filed on Oct. 23, 2012 and entitled "Semiconductor Device and Fabrication Method Thereof", which is incorporated herein by reference in its entirety.

BACKGROUND

1. Field of the Invention

The present disclosure relates to the field of semiconductor device fabrication, and more particular, to a semiconductor device and its fabrication method.

2. Description of the Related Art

Embedded SiGe (eSiGe) is a process that has been proposed to improve channel stress of a MOS (Metal oxide Semiconductor) device, and increase carrier mobility. In an embedded SiGe (eSiGe) process, the source region and the drain region are formed by eSiGe to apply a stress to the channel region. In order to achieve a better effect, in general, it is necessary to perform recess etching before SiGe epitaxial growth on the source region/drain region. The recess etching forms a Sigma ("Σ") shaped recess, after which SiGe is epitaxially grown in the Sigma shaped recess. As a result, the effect of the stress application is enhanced and semiconductor device performance is improved.

The SiGe epitaxial growth needs to be sufficiently close to the channel to increase stress; however, in the epitaxial growth, if P-type impurities are in-situ doped at a high concentration from the beginning, the short-channel effect may be intensified.

In order to address the above problem, presently, it is common to epitaxially grow a substantially un-doped layer of SiGe first, followed by the epitaxial growth of high concentration p-type doped SiGe.

SUMMARY

According to a first, a semiconductor device fabrication method is provided, including providing a substrate, on which a gate structure is formed; etching the substrate to form a recess at a source/drain position in the substrate; forming removable sidewalls on side walls of the recess; etching the recess to form a Sigma shaped recess; performing selective epitaxial growth of substantially un-doped SiGe in the Sigma shaped recess; removing the removable sidewalls; performing epitaxial growth of SiGe doped with P-type impurities in the Sigma shaped recess.

Etching the substrate to form the recess at the source/drain position in the substrate may include forming a U shaped depression at the source/drain position in the substrate by self-aligned etching of the substrate.

Forming removable sidewalls on side walls of the recess may include forming the removable sidewalls through chemical vapour deposition (CVD) and anisotropic etching process.

Removing the removable sidewalls may include removing the removable sidewalls by at least one of a wet etching process and an isotropic dry etching process.

The depth of the recess may be in a range of 5 nm to 20 nm.

The method may further include, before forming the recess, forming an offset spacer for the gate structure; performing LDD implantation and annealing process; and, after performing epitaxial growth of SiGe doped with P-type impurities in the Sigma shaped recess, performing source/drain ion implantation.

The removable sidewalls may be formed after the LDD implantation and before the formation of the recess.

The removable sidewalls may be formed after performing epitaxial growth of SiGe doped with P-type impurities in the Sigma shaped recess and before the source/drain ion implantation.

The selective epitaxial growth of substantially un-doped SiGe may include selective epitaxial growth of SiGe doped with impurities of the same type as the channel.

According to another aspect, a semiconductor device is provided including a gate structure formed on a substrate of the semiconductor device; a Sigma shaped recess formed in the substrate beside the gate structure; a layer of substantially un-doped SiGe epitaxially grown on the interior surface of the Sigma shaped recess, and a bulk section of SiGe doped with P-type impurities epitaxially grown on the layer of substantially un-doped SiGe within the Sigma shaped recess, wherein the layer of substantially un-doped SiGe is located within the Sigma shaped recess at a predetermined depth under the surface of the substrate.

The predetermined depth may be in a range of 5 nm~20 nm.

The offset spacer may be formed on the two sides of the gate structure.

In the fabrication method and semiconductor device disclosed herein, in the epitaxy of un-doped SiGe, the surface layer of the substrate is protected from epitaxy by the removable sidewalls, after which in-situ epitaxy of doped SiGe is performed; the in-situ doped SiGe may reduce source-drain series resistance and improve device performance.

Other features and advantages will become apparent from the detailed description of exemplary embodiments given below with reference to accompanying drawings.

BRIEF DESCRIPTION OF THE DRAWINGS

The accompanying drawings, which are incorporated in and constitute a part of the specification, illustrate embodiments of the disclosure.

With reference to those drawings, from the following detailed description, the example embodiments can be understood more clearly, wherein.

DESCRIPTION OF THE EMBODIMENTS

Figure 1A:
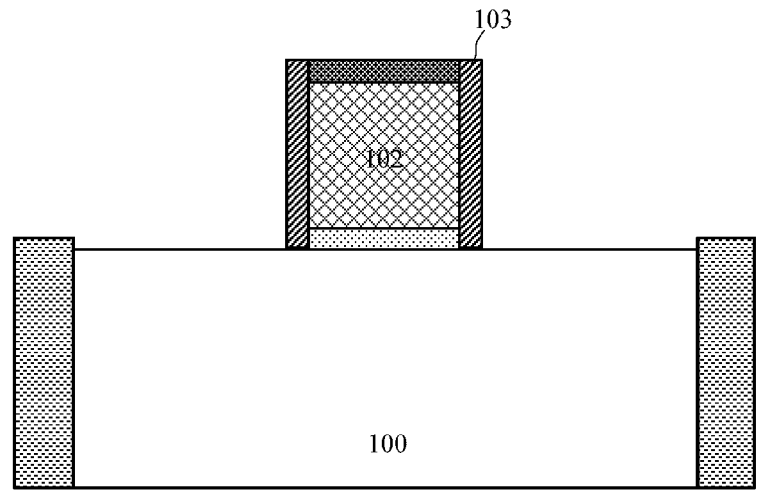
FIG. 1A to FIG. 1G schematically show section views of various steps of a semiconductor device fabrication method according to an embodiment.

Various exemplary embodiments will now be described in detail with reference to the drawings. It should be noted that the relative arrangement of the components and steps, the numerical expressions, and numerical values set forth in these embodiments do not limit the scope of the present disclosure unless it is specifically stated otherwise.

It should be appreciated that, for the convenience of description, various parts shown in those drawings are not necessarily drawn on scale.

The following description of at least one exemplary embodiment is merely illustrative in nature and is in no way intended to limit the disclosure, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Similar reference numerals and letters refer to similar items in the following figures, and thus once an item is defined in one figure, it is possible that it need not be further discussed for following figures.

The common method of addressing the problem of intensified short-channel effect when using eSiGe to increase channel stress, as discussed above, is to epitaxially grow a substantially un-doped layer of SiGe first, followed by the epitaxial growth of high concentration p-type doped SiGe. However, it has been found that, because the substantially un-doped SiGe layer is located under sidewalls, such a layer is unable to be sufficiently doped in subsequent source-drain implantation, which may increase source-drain series resistance. The embodiments disclosed herein provide a new technical solution targeted to this problem.

FIG. 1A to FIG. 1G schematically show section views of a semiconductor device fabrication method according to an embodiment.

As shown in FIG. 1A, a substrate 100 is provided, on which a gate structure 102 is formed. The gate structure 102 can be formed through a variety of existing methods, and the gate structure can be selected according to the particular requirements of the resulting device. Optionally, offset spacers 103 are further formed on both sides of the gate structure 102, wherein the offset spacers 103 may include, for example, $SiO_2$ or SiN as its major composition.

Figure 1B:
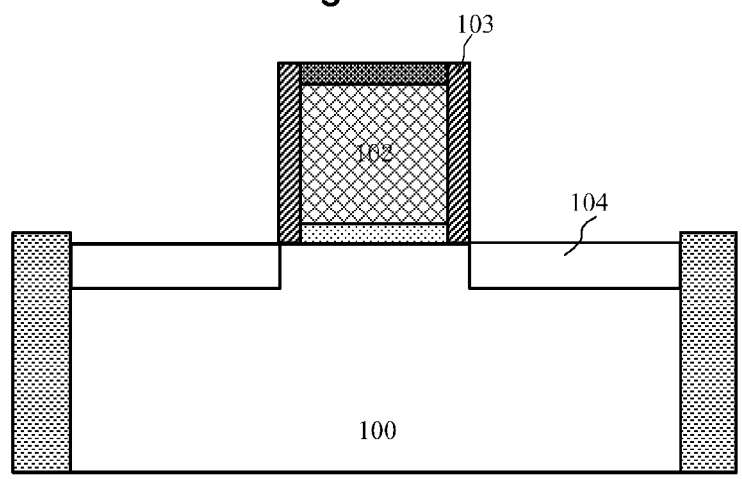

As shown in FIG. 1B, the substrate 100 is etched at source/drain positions, which are adjacent to the gate, to form a recess 104. In the substrate 100, for example, recess 104 is formed at source/drain positions beside the gate structure through dry etching process. In one embodiment, the depth of the recess 104 is, for example, about ¼~⅓ of the depth of the channel. For example, the depth of the recess 104 may be in the range of 5 nm~20 nm.

Figure 1C:
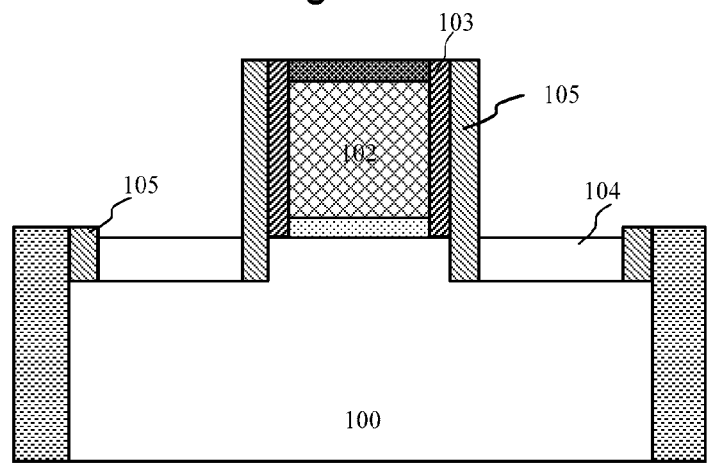

As shown in FIG. 1C, removable sidewalls 105 are formed on the side surfaces of the recess 104. The removable sidewalls 105 can be formed on the side surfaces of the recess 104 through, for example, chemical vapour deposition (CVD) and an anisotropic etching process. The removable sidewall 105 may include, for example, SiN or $SiO_2$ as its major composition, and has a selection etching rate as compared to the offset spacer 103 (that is, removable sidewall 105 can be etched while leaving offset spacer 103 relatively intact).

Figure 1D:
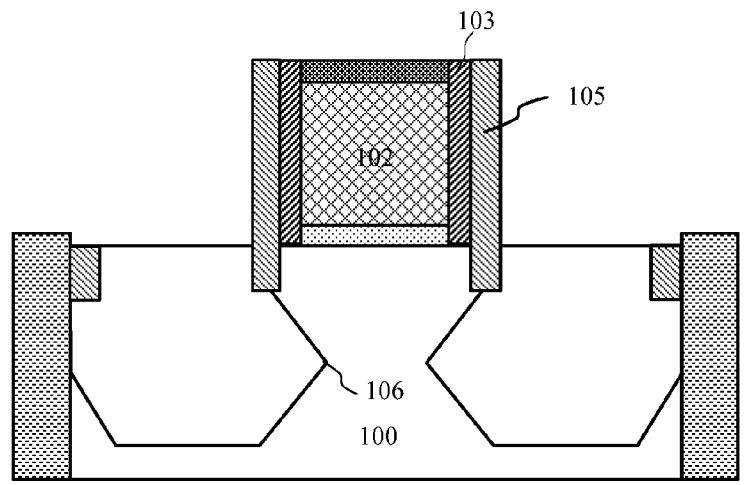

As shown in FIG. 1D, the recess 104 is further etched to form a Sigma shaped recess 106. For example, the Sigma shaped recess 106 can be formed by etching the substrate in the recess 104 using a crystal orientation selective etchant for wet etching, for example, an etchant comprising tetramethylammonium hydroxide (TMAH).

Figure 1E:
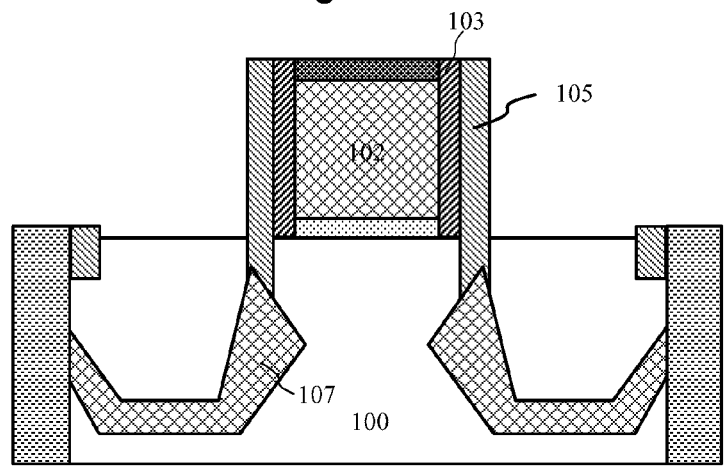

As shown in FIG. 1E, selective epitaxial growth (SEG) of substantially un-doped SiGe is performed in the Sigma shaped recess 106 to produce a layer of substantially un-doped SiGe 107; the selective epitaxial growth (SEG) of substantially un-doped SiGe may also include selective epitaxial growth of SiGe doped with impurities of the same type as the channel.

Figure 1F:
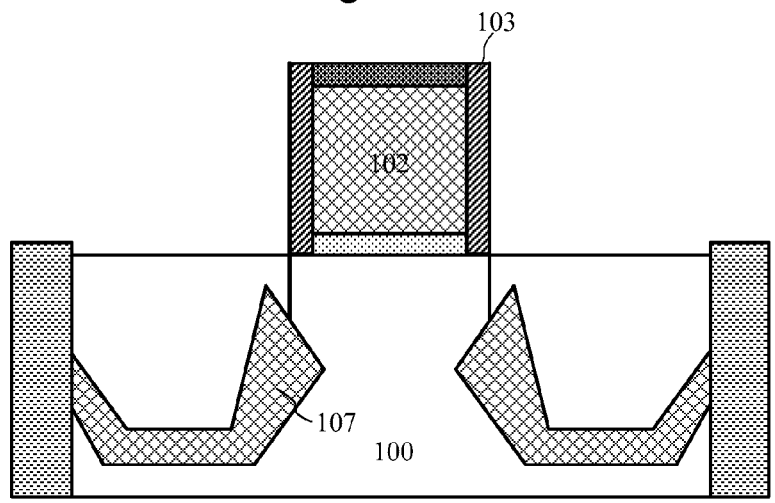

As shown in FIG. 1F, the removable sidewalls 105 are removed. For example, the removable sidewalls 105 can be removed through wet etching or isotropic dry etching process.

Figure 1G:
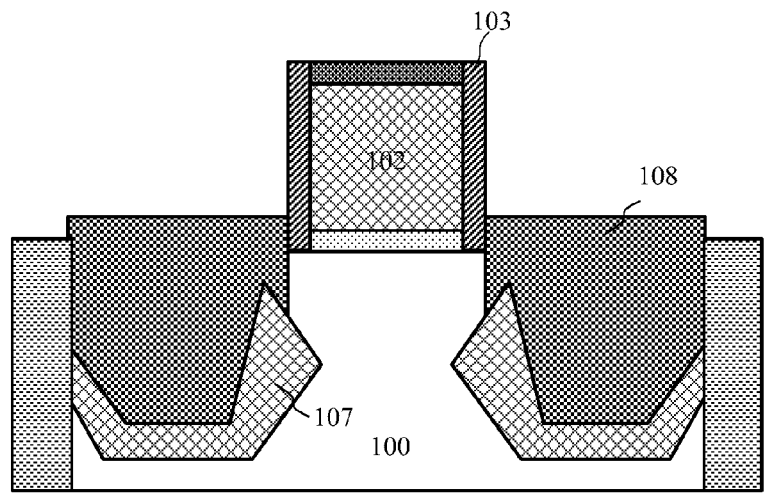

As shown in FIG. 1G, epitaxial growth of SiGe doped with P-type impurities is performed in the Sigma shaped recess 106. For example, in-situ selective epitaxial growth of SiGe can be performed.

In the above embodiment, in the epitaxial growth of un-doped SiGe, the surface layer of the substrate can be protected from the epitaxial growth by the removable sidewalls. After which, the protective sidewalls can be removed, and SiGe can be in-situ doped, so that a sufficient distance between the source and drain junctions can be guaranteed while a sufficient stress is applied, which may avoid the short-channel effect. Further, un-doped SiGe does not incur a high-resistance layer in the conductive channel, so that device performance degradation can be avoided and device performance can be improved.

FIG. 2A to FIG. 2J schematically show section views of a semiconductor device fabrication method according to another embodiment.

Figure 2A:
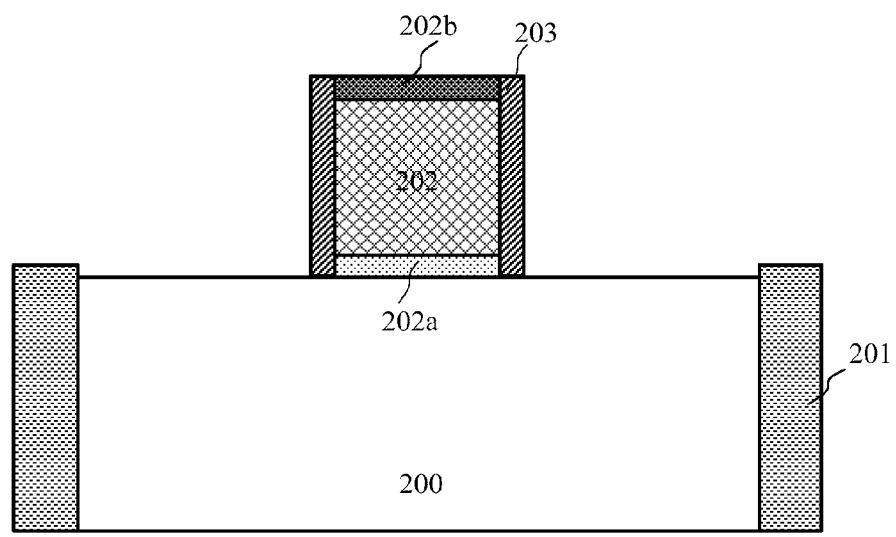
FIG. 2A to FIG. 2J schematically show section views of various steps of a semiconductor device fabrication method according to another embodiment.

As shown in FIG. 2A, a substrate 200 is provided, on which an STI (Shallow Trench Isolation) 201 is formed. A gate dielectric is grown, a gate material and a layer of hard mask are deposited, and then gate photolithography is performed to form a gate dielectric layer 202a, a gate 202, and a hard mask layer 202b on the gate 202. A dielectric layer is deposited and etched to form offset spacers 203 on both sides of the gate structure 202.

Figure 2B:
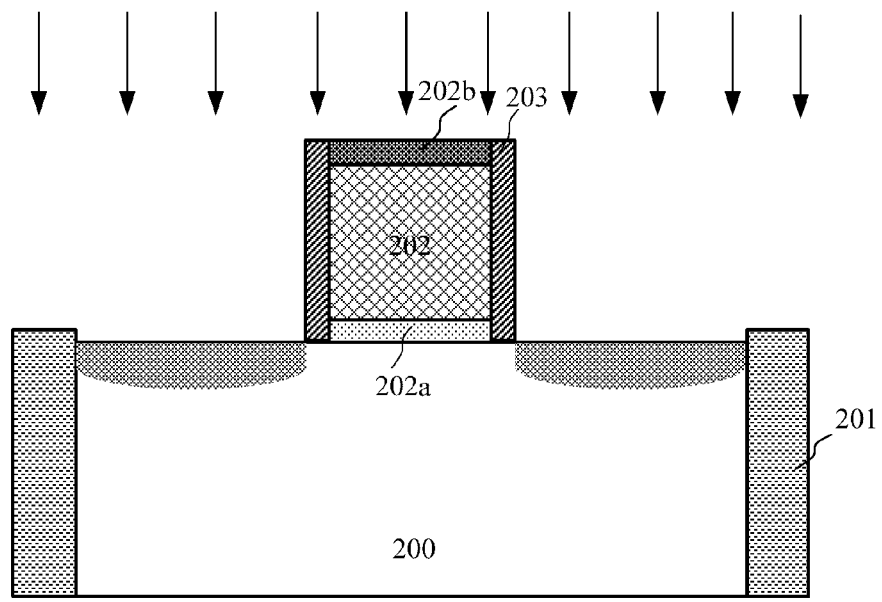

As shown in FIG. 2B, LDD (Lightly Doped Drain) implantation and annealing are performed.

Figure 2C:
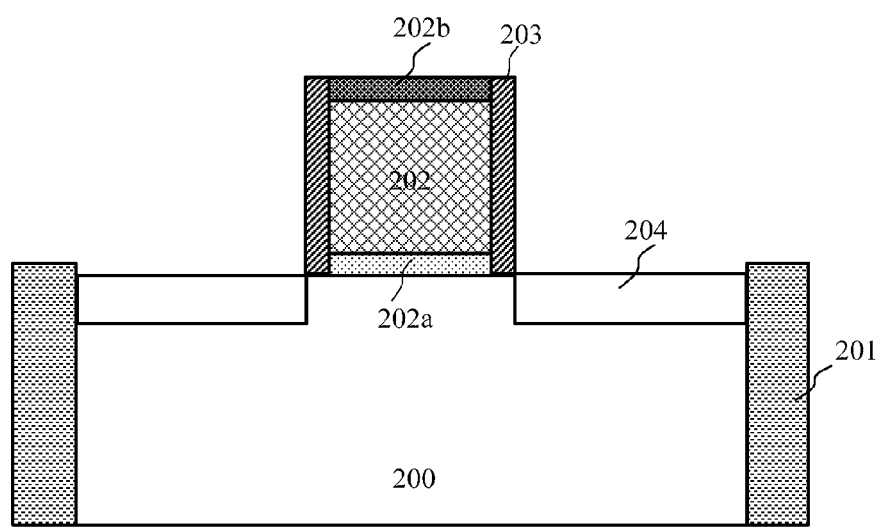

As shown in FIG. 2C, a recess 204 is formed at a source/drain position in the substrate 200 through a self-aligned etching process. The recess 204 may be, for example, a U shaped depression.

Figure 2D:
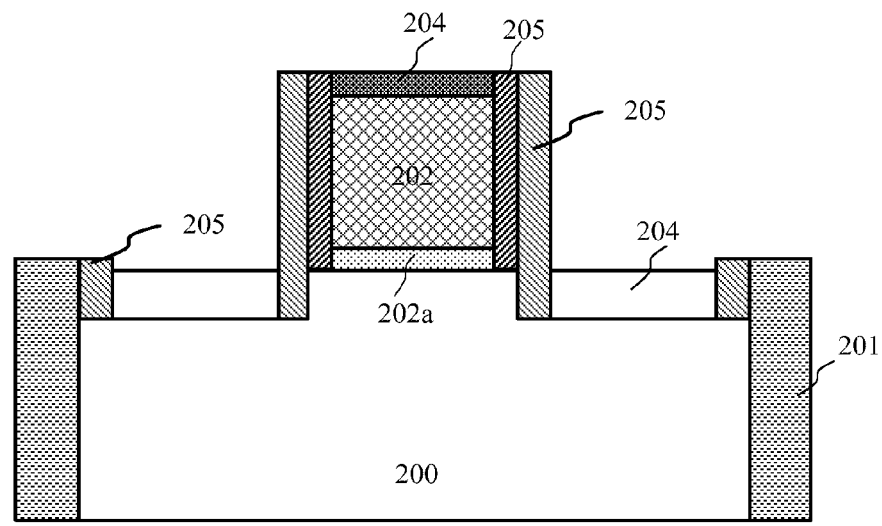

As shown in FIG. 2D, removable sidewalls 205 are formed on side surfaces of the recess 204.

Figure 2E:
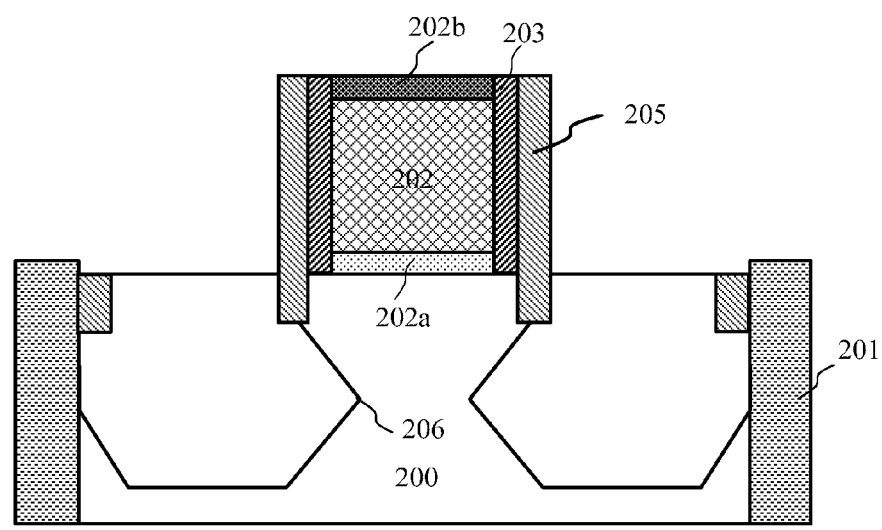

As shown in FIG. 2E, a Sigma shaped recess 206 is formed by etching the recess 204.

Figure 2F:
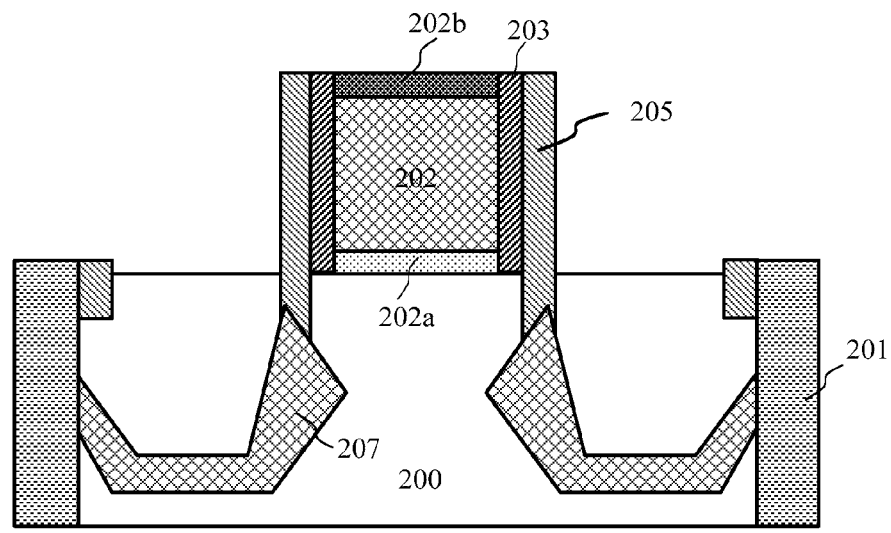

As shown in FIG. 2F, selective epitaxial growth of substantially un-doped SiGe is performed in the recess 204 to produce a SiGe seed layer 207.

Figure 2G:
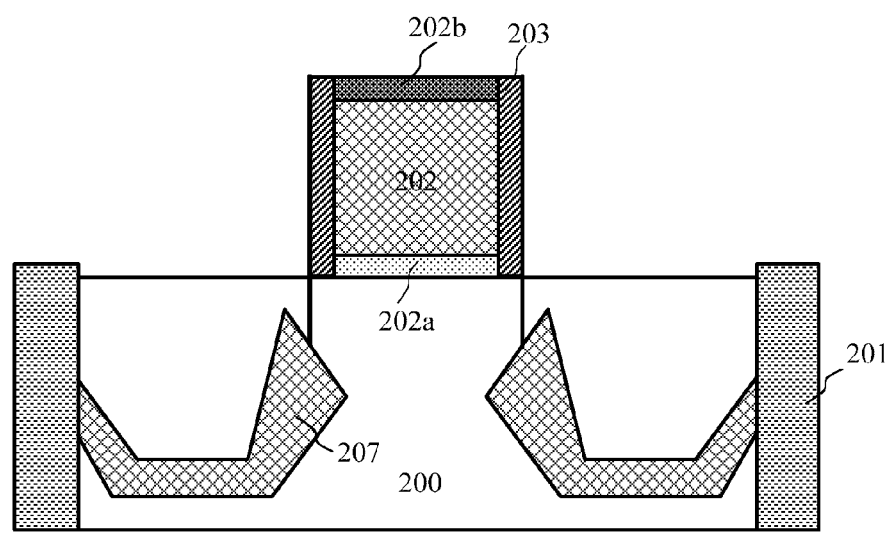

As shown in FIG. 2G, the removable sidewalls 205 are removed.

Figure 2H:
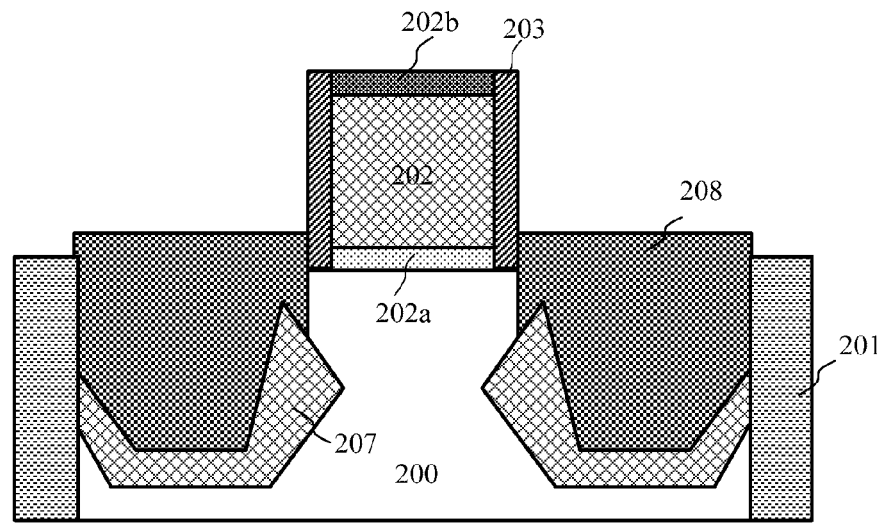
Figure 2I:
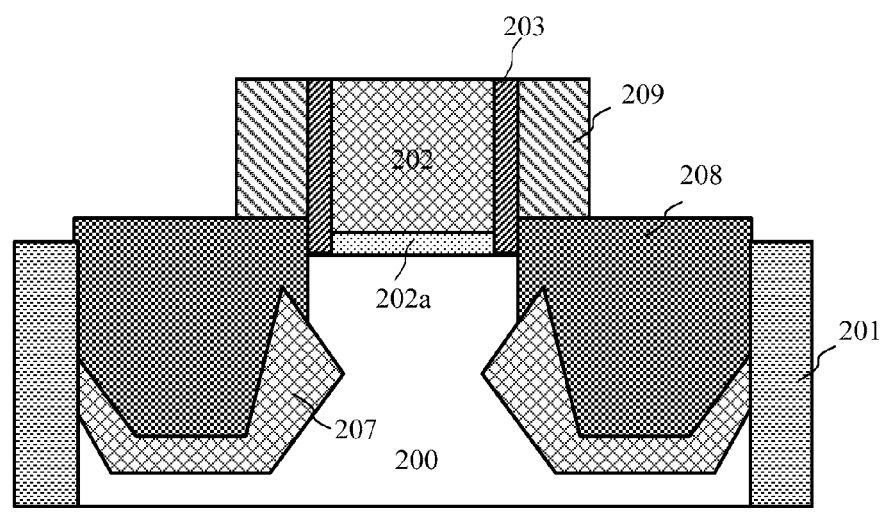

As shown in FIG. 2H, selective source/drain epitaxy is performed in the Sigma shaped recess 206, and in-situ doping is performed at the same time, to obtain a bulk of SiGe 208 doped with P-type impurities.

As shown in FOG. 2I, the hard mask 202b is removed and sidewalls 209 are formed on the outer walls of the offset spacers 203.

Figure 2J:
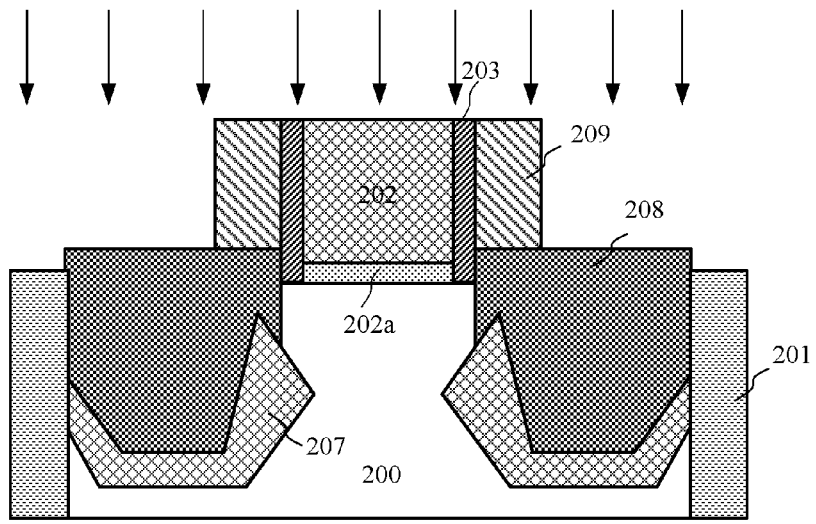

As shown in FIG. 2J, source-drain implantation is performed, and the subsequent process can be compatible with the HKMG (high-k metal gate) process.

In the above embodiment, a recess is formed after LDD implantation and annealing, removable sidewalls are formed on the side surfaces of the recess, and in the epitaxial growth of the SiGe seed layer, the internal walls of the recess close to the substrate surface can be protected from SiGe growth by the removable sidewalls. The sidewalls can be removed before the growth of in-situ doped SiGe, so that the in-situ doped SiGe bulk grows at the portion of the Sigma shaped recess close to the surface of the substrate, which avoids the generation of a high resistance area, and can improve device performance. The hard mask can protect the gate from being contaminated or damaged during the process.

FIG. 3A to FIG. 3J schematically show section views of a semiconductor device fabrication method according to still another embodiment.

Figure 3A:
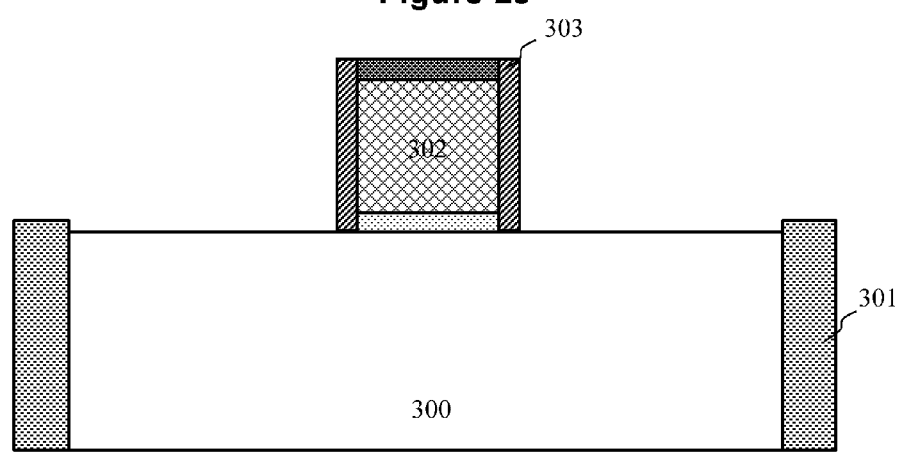
FIG. 3A to FIG. 3J schematically show section views of various steps of a semiconductor device fabrication method according to still another embodiment.

As shown in FIG. 3A, a substrate 300 is provided, on which a STI 301 is formed. A gate structure 302 is formed on the substrate 300. An offset spacer 303 is further formed on both sides of the gate structure 302.

Figure 3B:
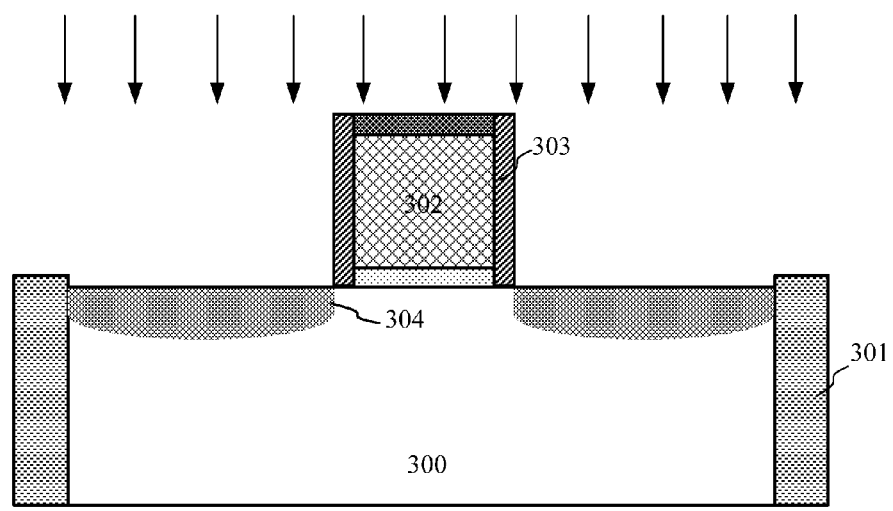

As shown in FIG. 3B, a lightly doped region 304 is formed through LDD implantation, followed by an annealing process.

Figure 3C:
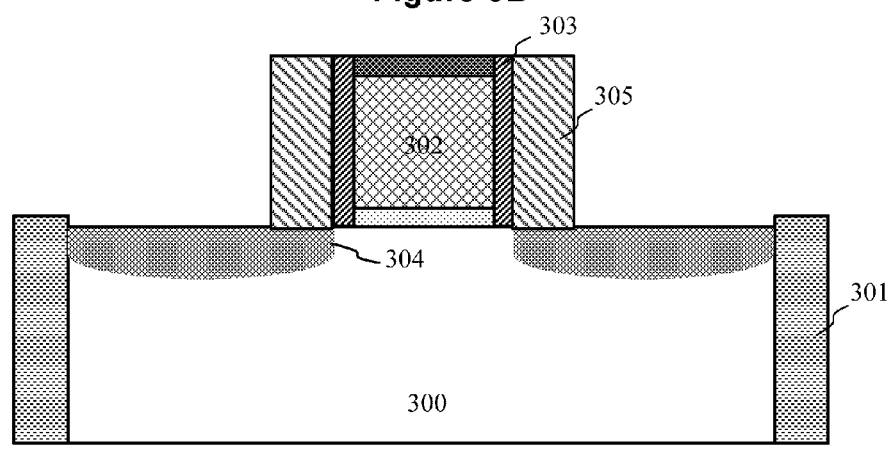

As shown in FIG. 3C, sidewalls 305 are formed on the outer walls of the offset spacer 303.

Figure 3D:
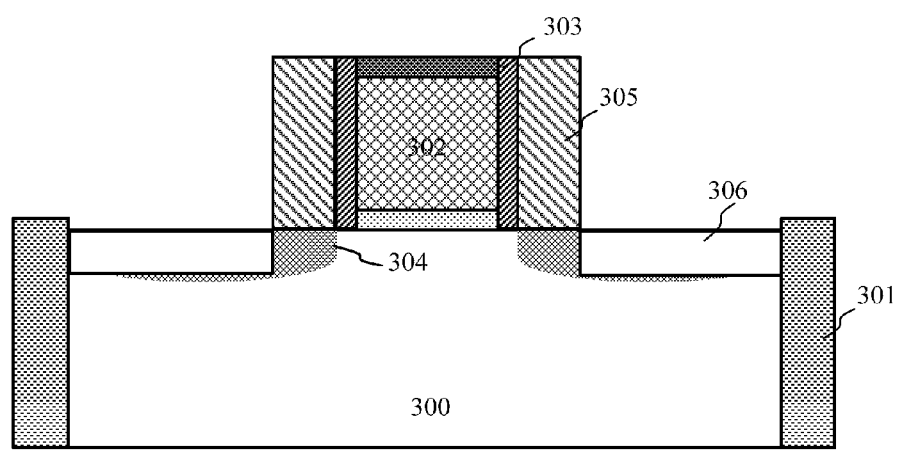

As shown in FIG. 3D, a recess 306 is formed at a source/drain position in the substrate 300 by etching the substrate 300.

Figure 3E:
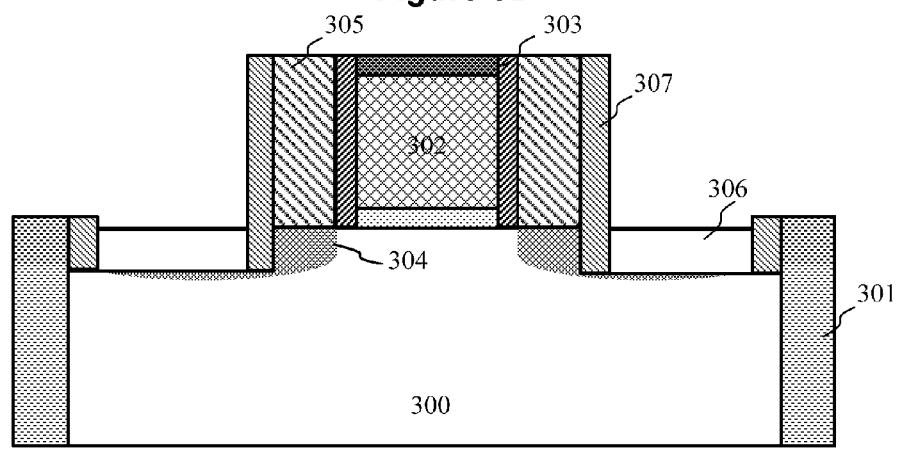

As shown in FIG. 3E, removable sidewalls 307 are formed on side surfaces of the recess 306.

Figure 3F:
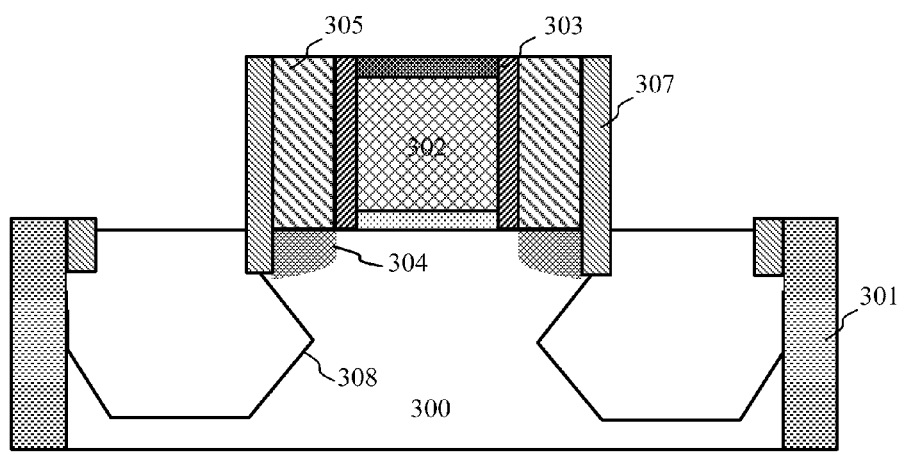

As shown in FIG. 3F, a Sigma shaped recess 308 is formed by etching the recess 306.

Figure 3G:
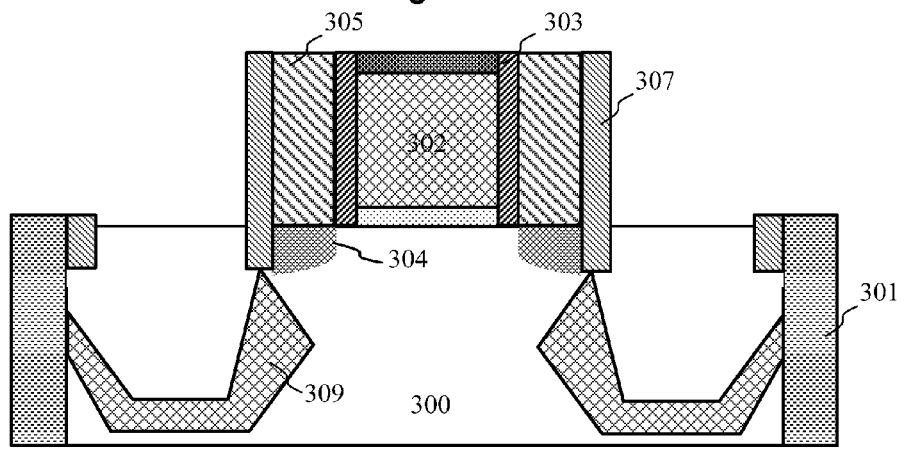

As shown in FIG. 3G, selective epitaxial growth of substantially un-doped SiGe is performed in the recess 204 to produce a SiGe seed layer 309.

Figure 3H:
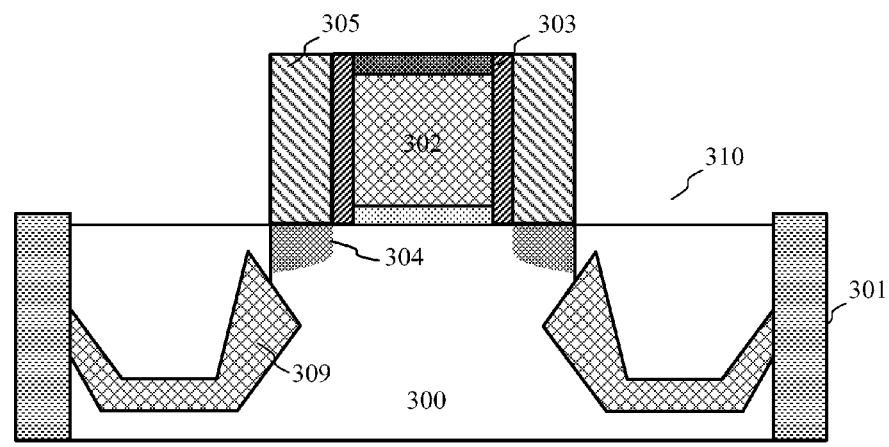

As shown in FIG. 3H, the removable sidewalls 307 are removed.

Figure 3I:
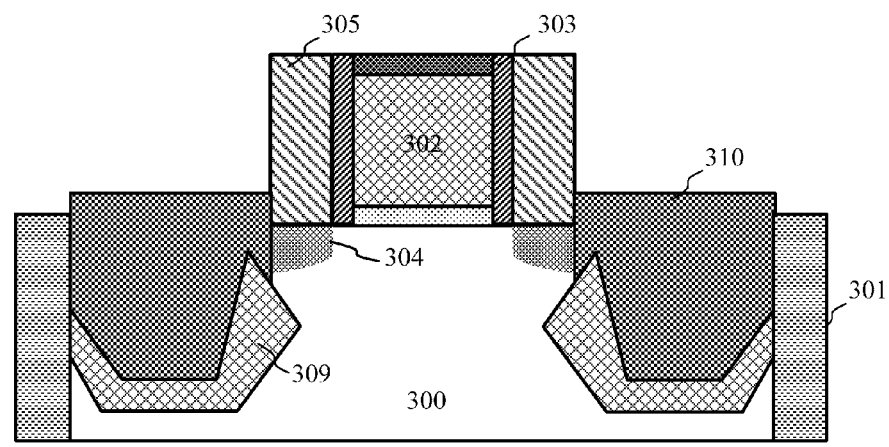

As shown in FIG. 3I, selective source/drain epitaxy is performed in the Sigma shaped recess 306 to obtain a bulk of SiGe 308 doped with a P-type impurity.

Figure 3J:
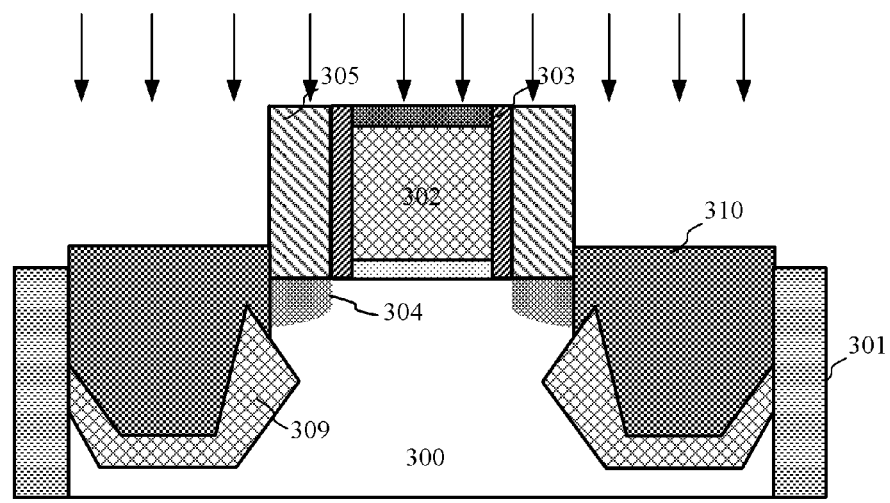

As shown in FIG. 3J, source-drain implantation is performed.

In the above embodiment, sidewalls are formed before the formation of the Sigma shaped recess, which can also be used to protect the internal walls of the recess close to the substrate surface from the growth of the substantially un-doped SiGe seed layer, so that device performance can be improved.

Figure 4:
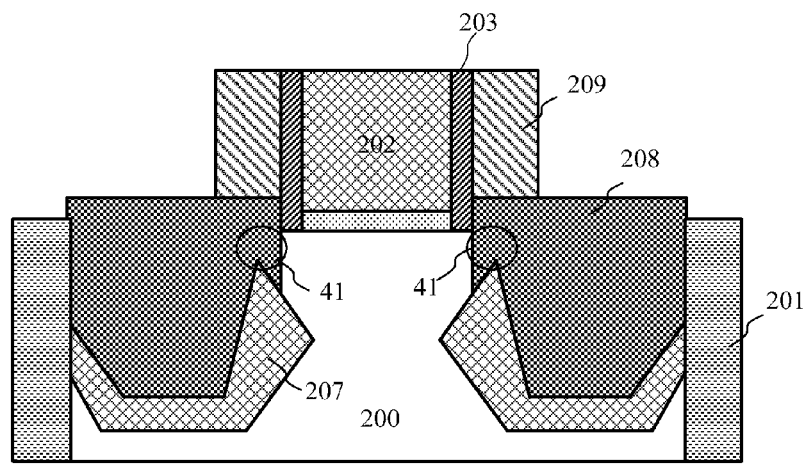
FIG. 4 shows a structure diagram of a semiconductor device according to an embodiment.

FIG. 4 shows a structure diagram of a semiconductor device according to an embodiment. As shown in FIG. 4, a gate structure 202 is formed on a substrate 200 of the semiconductor device, and a Sigma shaped recess is formed in the substrate beside the gate structure 202; a layer of substantially un-doped SiGe 207 is epitaxially grown on the interior surface of the Sigma shaped recess, and a bulk of SiGe 208 doped with a P-type impurity is epitaxially grown on the layer of substantially un-doped SiGe 207. The layer of substantially un-doped SiGe 207 is located within the Sigma shaped recess at a predetermined depth under the surface of the substrate. That is, the portion circled and labelled by reference number 41 in FIG. 4 does not have the layer of substantially un-doped SiGe 207. Furthermore, there are offset spacers 203 formed on the side surfaces of the gate structure 202, and sidewalls 209 formed on the side surfaces of the offset spacers 203.

In the fabrication method and device disclosed herein, a sufficient distance between the source and drain junctions can be guaranteed while a sufficient stress is applied, which may avoid the short-channel effect. Further, un-doped SiGe does not incur a high-resistance layer in the conductive channel, so that device performance degradation can be avoided and device performance can be improved.

Thus, the semiconductor device fabrication method and the semiconductor device have been described in detail. Certain portions of the method well known to those of ordinary skill in the art are not described herein in order to prevent obscuring the concept of this disclosure. From the above description, those having ordinary skill in the art may fully understand how to implement the technical solutions disclosed herein.

Although some specific embodiments have been demonstrated in detail with examples, it should be understood by a person of ordinary skill in the art that the above examples are only intended to be illustrative but not to limit the scope of the present disclosure. It should be understood by a person of ordinary skill in the art that the above embodiments can be modified without departing from the scope and spirit of the present disclosure, including the attached claims.

What is claimed is:

1. A semiconductor device fabrication method comprising:
   providing a substrate on which a gate structure is formed;
   etching the substrate to form a recess at a source/drain position in the substrate;
   forming removable sidewalls on side walls of the recess;
   etching the recess to form a Sigma shaped recess;
   performing selective epitaxial growth of substantially un-doped SiGe in the Sigma shaped recess;
   removing the removable sidewalls;
   performing epitaxial growth of SiGe doped with P-type impurities in the Sigma shaped recess.

2. The method according to claim 1, wherein etching the substrate to form the recess at the source/drain position in the substrate comprises:
   forming a U shaped depression at the source/drain position in the substrate by self-aligned etching of the substrate.

3. The method according to claim 1, wherein forming the removable sidewalls on the side walls of the recess comprises:
   forming the removable sidewalls by chemical vapour deposition (CVD) and anisotropic etching process.

4. The method according to claim 1, wherein removing the removable sidewalls comprises:
   removing the removable sidewalls through at least one of a wet etching process and an isotropic dry etching process.

5. The method according to claim 1, wherein the depth of the recess is in a range of 5 nm to 20 nm.

6. The method according to claim 1, further comprising:
   before forming the recess, forming an offset spacer for the gate structure, and performing LDD implantation and annealing process; and
   after performing the epitaxial growth of SiGe doped with P-type impurities in the Sigma shaped recess, performing source/drain ion implantation.

7. The method according to claim 6, wherein the removable sidewalls are formed after the LDD implantation and before the formation of the recess.

8. The method according to claim 6, wherein the removable sidewalls are formed after performing the epitaxial growth of SiGe doped with P-type impurities in the Sigma shaped recess and before the source/drain ion implantation.

9. The method according to claim 1, wherein the selective epitaxial growth of substantially un-doped SiGe comprises:
   selective epitaxial growth of SiGe doped with impurities of the same type as the channel.

* * * * *